(12) United States Patent
Ferguson et al.

(10) Patent No.: US 6,342,790 B1
(45) Date of Patent: Jan. 29, 2002

(54) HIGH-SPEED, ADAPTIVE IDDQ MEASUREMENT

(75) Inventors: Kenneth William Ferguson, Burnaby; Brian Gerson, Coquitlam, both of (CA)

(73) Assignee: PMC-Sierra, Inc., Burnaby (CA)

( * ) Notice: Subject to any disclaimer, the term of this patent is extended or adjusted under 35 U.S.C. 154(b) by 0 days.

(21) Appl. No.: 09/548,745

(22) Filed: Apr. 13, 2000

(51) Int. Cl.[7] .............................................. G01R 31/26
(52) U.S. Cl. ........................ 324/765; 324/763; 324/537
(58) Field of Search ................................. 324/765, 768, 324/769, 537, 763, 158.1

(56) References Cited

U.S. PATENT DOCUMENTS

| | | | |
|---|---|---|---|
| 5,332,973 A | * 7/1994 | Brown et al. | 324/765 |
| 5,789,933 A | 8/1998 | Brown et al. | 324/765 |
| 5,808,476 A | * 9/1998 | Lee et al. | 324/765 |
| 5,889,408 A | 3/1999 | Miller | 324/765 |

OTHER PUBLICATIONS

M. Keating and D. Meyer, "A New Approach to Dynamic IDD Testing," *Proceedings of IEEE International Test Conference*, Feb. 1987, pp. 316–321.

K. M. Wallquist, "Achieving IDDQ/ISSQ Production Testing With QuiC–Mon", *IEEE Design& Test of Computers*, vol. 12, Fall 1995, pp. 62–69, No month available.

\* cited by examiner

*Primary Examiner*—Safet Metjahic
*Assistant Examiner*—Vincent Q. Nguyen
(74) *Attorney, Agent, or Firm*—Oyen Wiggs Green & Mutala

(57) ABSTRACT

Test device (DUT) current flow is mirrored through a capacitor. If the mirrored current is switched to bypass the capacitor, the capacitor discharges. Otherwise, the mirrored current charges the capacitor. The charging capacitor's voltage rise time is proportional to the DUT's IDDQ current. Several IDDQ reference values can be derived, each representing quiescent state operation of a defect-free copy of the DUT. An IDDQ test value is derived for each IDDQ reference value. Each test value represents quiescent state operation of the DUT after application of the test vector which produced the corresponding reference value. The reference values are compared to their corresponding test values and a plurality of scaling factors derived. Each scaling factor represents a proportionality between corresponding reference and test values. The DUT is "non-defective" if the scaling factors are equal within a predefined error range. Otherwise, the DUT is "defective".

12 Claims, 5 Drawing Sheets

HIGH-SPEED, ADAPTIVE IDDQ MEASUREMENT

TECHNICAL FIELD

This invention facilitates very fast power supply quiescent current (IDDQ) measurements, and provides a technique for performing signature analysis on the measurements, in order to screen defective devices in the presence of high background leakage currents.

BACKGROUND

Integrated circuits containing very large numbers of devices such as transistors must be tested for defects before they are shipped to customers. A technique called "IDDQ testing" is commonly used in defect testing of integrated circuits containing CMOS devices. IDDQ testing is performed by stopping all clock signals applied to the device under test (DUT). This places the DUT in a quiescent state in which the current flow through the DUT is characterized by a so-called "IDDQ" quiescent current in contrast to the "IDDD" dynamic current which flows during normal clocked operation of the DUT. Various defects can be detected by measuring IDDQ current flow through the DUT when the DUT is in the quiescent state, and comparing the measured IDDQ value to predefined values representative of IDDQ current values for similar devices which are known to be either defective or defect-free.

Conventional IDDQ testing becomes impractical as the fundamental dimensions of the DUT are reduced, since the background leakage current increases as such dimensions are decreased. It is necessary to reduce such dimensions in order to increase the number of devices that can be contained in an integrated circuit. But, the saturation current of a single defective transistor stays about the same, or may even decrease. Consequently, a change in IDDQ current due to the presence or absence of a defect becomes much smaller than changes caused by inherent process variations from one device to another, or changes due to temperature variations, making it impossible to distinguish good devices from bad devices with a fixed measurement limit.

Typically, IDDQ testing is performed by automated test equipment (ATE) which places the DUT in the quiescent state by applying a test pattern electronic signal to the DUT. A parametric measurement unit (PMU) or high precision ammeter is then used to measure the IDDQ current flowing through the DUT. This is an extremely slow technique, in that only a small number of measurements (about 10) can be included in a production test. The partitioned design methodology typically used for "system-on-a-chip" (SOC) devices severely limits the maximum test coverage which can be obtained if only a small number of IDDQ measurements can be made.

Alternate, higher-speed IDDQ measurement techniques have been based on loadboard-mounted IDDQ monitoring circuitry. In one such technique (see M. Keating and D. Meyer, "A New Approach to Dynamic IDD Testing," *Proceedings of IEEE International Test Conference*, 1987, pp. 316–321) the decay of the DUT decoupling capacitance is monitored after the DUT is disconnected from the device power supply (DPS). This technique can be enhanced by differentiating the decay signal and comparing the result to a fixed reference (see: K. M. Wallquist, Achieving IDDQ/ ISSQ Production Testing With QuiC-Mon, *IEEE Design & Test of Computers*, Vol 12, Fall 1995). But, both techniques suffer from the disadvantage that they are sensitive to the device decoupling capacitance, and also that they require disconnecting the DUT from the DPS during operation, which can lead to latch-up conditions.

More recently, "delta IDDQ testing" has been used in IDDQ testing of sub-micron devices (see U.S. Pat. No. 5,889,408). However, delta IDDQ testing has limited viability, since background leakage current values can exceed IDDQ values on some defect-free sub-micron devices. The problem is especially acute for very deep sub-micron devices having fundamental dimensions less than 0.25 $\mu$m. Any methodology based on an ability to discriminate between fixed IDDQ values and fixed background leakage current values can be expected either to falsely fail defect-free devices, or falsely pass defective devices at some point as fundamental DUT dimensions decrease and background leakage currents increase.

What is required is an IDDQ testing technique that is fast enough to permit good IDDQ test coverage to be obtained on SOC-type devices, without compromising production test times. Preferably, at least one IDDQ measurement should be made during execution of the scan vectors for each partition in the DUT, while maintaining a total test time of under one second (including vector execution). This requires a maximum test time on the order of a few milliseconds. The technique must be insensitive to loadboard construction to ensure reliable correlation between multiple test fixtures and ATE platforms; must not subject the DUT to possible damage due to latch-up; and, must be insensitive to anticipated variations in background leakage current due to normal process and temperature variations encountered in fabrication of deep sub-micron devices (i.e. devices having fundamental dimensions less than 0.25 $\mu$m). The present invention satisfies these considerations.

SUMMARY OF THE INVENTION

The invention facilitates measurement of IDDQ values which characterize a DUT. A current mirror "mirrors" the current flowing from a power supply through the DUT, such that the same current flows through a second current path coupling the power supply to an integrator. A first switch switches the second current path between a first state in which current flowing in the second current path bypasses the integrator, and a second state in which current flowing in the second current path flows through the integrator. The rise time of the voltage produced across the integrator as current flows through the integrator is proportional to and therefore representative of an IDDQ value which characterizes the DUT.

Preferably, the integrator is a capacitor and the first switch is a transistor connected across the capacitor. Application of a first logic signal to the transistor turns the transistor on, causing current flowing in the second current path to bypass the capacitor, thereby discharging the capacitor. Application of a second logic signal to the transistor turns the transistor off, causing current flowing in the second current path to flow through the capacitor, thereby charging the capacitor. The rise time of the voltage produced across the charging capacitor is proportional to and therefore representative of an IDDQ current value which characterizes the DUT.

A buffer connected in parallel across the capacitor provides a means for measuring rise time of the voltage produced across the capacitor during charging of the capacitor. An optional second switch can be coupled between the power supply, current mirror and DUT to disconnect the DUT from the current mirror, without disconnecting the DUT from the power supply. This facilitates bypassing of the current mirror during high-current functional tests such as at-speed tests, without subjecting the DUT to possible damage due to latch-up which can occur if the DUT is disconnected from the power supply. Advantageously, the second switch may be a double pole double throw relay switch having a first pole pair switchable between the power supply and the current mirror and a second pole pair switchable between the current mirror and a null point.

In some embodiments, the capacitor need not be a discrete capacitor component, but may be represented by the transistor's inherent discharge (parasitic drain-to-source) capacitance $C_{DS}$, if $C_{DS}$ has the appropriate order of magnitude.

The invention also provides a method of measuring IDDQ values characterizing a DUT. Current flowing through the DUT is "mirrored" to flow through a second current path. The DUT is first operated in a non-quiescent state while the second current path is switched to cause the mirrored current path to bypass a capacitor, thereby discharging the capacitor. During operation of the DUT in the non-quiescent state, test vectors are applied to the DUT until the DUT enters the quiescent state. The DUT is maintained in the quiescent state while the second current path is switched to cause the mirrored current to flow through the capacitor, thereby charging the capacitor. The rise time of the voltage produced across the capacitor, which is proportional to the DUT's IDDQ current value, is measured as the capacitor charges.

The method is repeated to obtain a plurality of measured rise time values (and hence IDDQ current values). Each measured rise time value is then compared to each one of a plurality of premeasured rise time values representative of operation of a known defect-free copy of the DUT in the quiescent state.

For each ith one of the measured rise time values, a value IDDQmin[i] representative of a lowest approximation of error in the ith one of the measured values of the rise time is derived; and, a value IDDQmax[i] representative of a highest approximation of error in the ith one of the measured values of the rise time is derived. A reference value IDDQref [i] is also derived for each ith one of the measured rise time values. IDDQref[i] is representative of operation of a known defect-free copy of the DUT in the quiescent state after application to the defect-free copy of the test vector for which the ith one of the measured rise time values was derived. An initial scale factor s=IDDQmin[1]/IDDQref[1] is derived. Then, for each ith one of a series of n measured rise time values, where $2 \leq i \leq n$, an iteration is performed in which:

(i) a value x=IDDQref[i]*s is derived;
(ii) if x>IDDQmax[i], the DUT is declared to be defective;
(iii) if IDDQmin[i] $\leq$x$\leq$IDDQmax[i], i is incremented and the iteration continues; and,
(iv) if x<IDDQmin[i], a new scale factor s=IDDQmin[i]/IDDQref[i] is derived, i is incremented, and the iteration continues;

If, for the resultant value of s, IDDQref[i]*s>IDDQmax[i] for any value of i, where $1 \leq i \leq n$, the DUT is declared to be defective. Otherwise, the DUT is declared to be non-defective.

The invention further provides a signature analysis method of analyzing a test device for defects. A plurality of IDDQ reference values are derived. Each IDDQ reference value is representative of the operation of a known defect-free copy of the test device in a quiescent state after application to the defect-free copy of a selected one of a plurality of test vectors. A corresponding IDDQ test value is derived for each one of the IDDQ reference values. Each IDDQ test value is representative of the operation of the test device in the quiescent state after application to the test device of the test vector which produced the corresponding IDDQ reference value. The IDDQ reference values are then compared to their respective corresponding IDDQ test values and a plurality of scaling factors are derived. Each scaling factor is representative of a proportionality between one of the IDDQ reference values and the corresponding IDDQ test value. The test device is declared to be non-defective if the scaling factors are equal to one another within an error range which is predefined with respect to the respective IDDQ test values. Otherwise, the test device is declared to be defective.

DESCRIPTION

Figure 1:
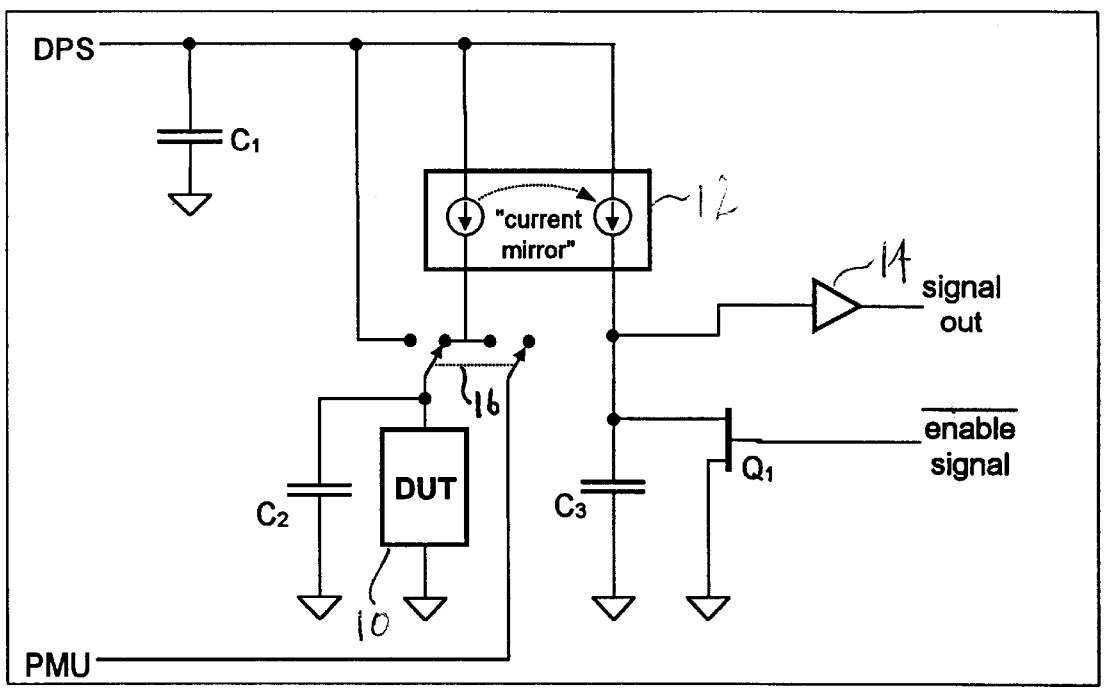
FIG. 1 is a schematic diagram of a loadboard monitoring circuit for making high-speed IDDQ measurements in accordance with the invention.
Figure 2A:
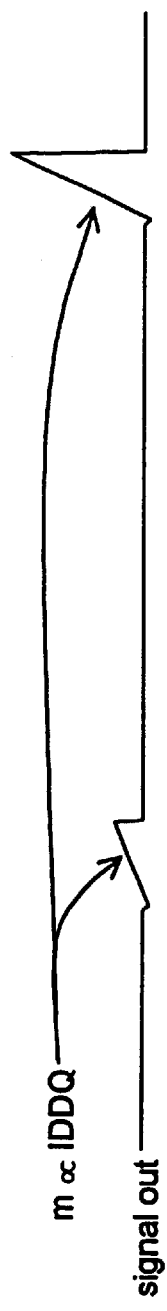
FIGS. 2A, 2B and 2C are electronic signal waveforms which graphically depict typical control voltages and IDDQ currents for the FIG. 1 circuit.
Figure 2B:
Figure 2C:

FIG. 1 depicts a loadboard monitoring circuit for making high-speed IDDQ measurements on DUT 10. Current mirror 12 is coupled between the device power supply (DPS); and, the current input paths of DUT 10 and bypass transistor $Q_1$ which functions as a "first switch". Specifically, $Q_1$ remains conductive as long as a logic high enable signal is applied to its base, thus providing a path to ground for the mirror current and discharging integrating capacitor $C_3$. When the enable signal changes to logic low $Q_1$ turns off, forcing the mirror current into $C_3$, which then begins to charge. The enable signal's falling edge (FIG. 2B) is used to trigger a suitable time measurement instrument (not shown) such as an oscilloscope, time interval analyzer, Wavecrest DTS-2075 time measurement unit, etc. to begin measurement of the IDDQ value, which is proportional to the rise time (slope, m) of the output signal (FIG. 2A) produced by buffer 14. As may be seen by comparing FIGS. 2B and 2C, the clock signal applied to DUT 10 is turned off sufficiently far in advance of the enable signal's high-to-low transition to place DUT 10 in the quiescent state to facilitate IDDQ measurement. After each IDDQ measurement $Q_1$, is turned back on to discharge $C_3$ in preparation for the next IDDQ measurement.

Buffer 14 prevents the time measurement instrument's input impedance (typically 50$\Omega$) from sinking all of the current and thereby preventing $C_3$ from charging. A "second switch", namely double-pole double-throw (DPDT) relay switch 16 is optional but recommended, and serves two purposes. First, DPDT relay switch 16 permits current mirror 12 to be bypassed during performance of high-current functional tests such as at-speed tests. Second, DPDT relay switch 16 permits routine calibration of the circuit by using a parametric measurement unit (PMU) as a precision current sink. During IDDQ measurement, DPDT relay 16 switch is in the position shown in FIG. 1, such that current drawn from the DPS flows through the DUT and is mirrored as aforesaid.

The FIG. 1 circuit affords a number of advantages. For example, current mirror 12 isolates integrating capacitor $C_3$ from the loadboard's decoupling capacitance ($C_1$, $C_2$), permitting use of a much smaller integrating capacitor, thereby facilitating much faster testing without interfering with optimal loadboard decoupling capacitor placement. Another advantage is that the combination of current mirror 12, integrating capacitor $C_3$ and bypass (discharge) FET $Q_1$, permits DUT 10 to remain connected to the power rail at all times, thereby avoiding the significant risk of damage to DUT 10 and automated test equipment due to device latch-up. DPDT relay switch 16 affords a further advantage by permitting DUT 10 to be completely isolated from the measurement circuit, preventing disruption of normal operation due to power rail "sag" due to the presence of current mirror 12. Usage of a PMU for frequent calibration is also advantageous in avoiding problems attributable to integrating capacitor accuracy and stability, without significant impact on test time. Usage of a high accuracy time measurement instrument to examine $C_3$'s rise time (FIG. 2A) permits precision numerical measurements to be made, enabling performance of signature analysis as hereinafter explained. Prior art high-speed IDDQ measurement techniques provide only logical pass/fail values and hence cannot be used to perform signature analysis as hereinafter explained.

Figure 3:
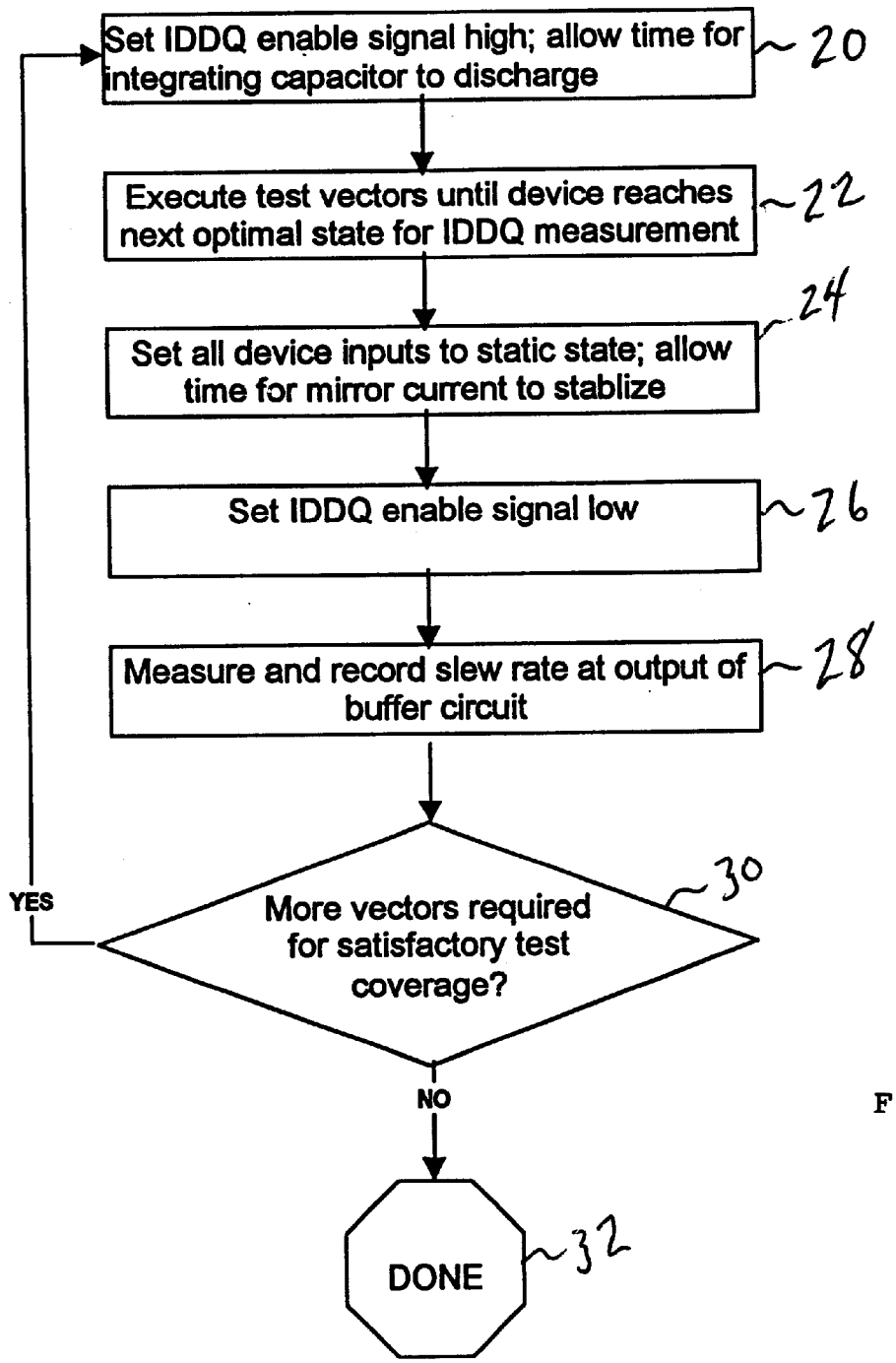
FIG. 3 is a flowchart depicting a technique for making IDDQ measurements with the FIG. 1 circuit.

Operation of the FIG. 1 circuit is more generally illustrated in FIG. 3, which depicts an algorithm for making IDDQ measurements in accordance with the FIG. 1 loadboard monitoring circuit. Initially, with DPDT relay switch 16 in the position shown in FIG. 1, a logic high enable signal is applied to $Q_1$'s base for a time sufficient to discharge $C_3$ (FIG. 3, block 20). Test vectors are then applied to DUT 10 in conventional fashion (FIG. 3, block 22) until DUT 10 is initialized into a quiescent state suitable for making IDDQ measurements. All clock signals applied to DUT 10 are then stopped maintain the quiescent state (FIG. 3, block 24). If necessary (i.e. depending upon DUT 10's clock rate relative to the settling time of current mirror 12) further time is allowed to enable the mirror current to stabilize. A logic low enable signal is then applied to $Q_1$'s base (FIG. 3, block 26), turning $Q_1$ off and forcing the mirror current into $C_3$. The IDDQ value is then measured (FIG. 3, block 28) by examining the rise time of the output signal produced by buffer 14. A test (FIG. 3, block 30) is then performed to determine whether further test vectors should be applied to DUT 10 to obtain a full complement of IDDQ measurements required for satisfactory testing of DUT 10. If the answer is "yes", then processing continues at block 20 as previously explained. Otherwise, testing is complete (FIG. 3, block 32) and the IDDQ measurements are analyzed as hereinafter explained.

The IDDQ value yielded by any particular measurement depends upon the number of internal nodes in DUT 10 that are in a logic "high" state, versus the number that are in a logic "low" state. This is because the off-state background leakage current of a P-type field effect transistor (FET) is significantly different from the off-state background leakage current of an N-type FET. By precisely measuring IDDQ values for a large number of different circuit states, one may obtain a "current signature" for DUT 10.

Transistors fabricated on different silicon wafers and/or on different dice fabricated from a single wafer inevitably exhibit "process" variations which affect the transistors' operating characteristics. For example, process variations may result in differences in the propagation delays of electronic signals processed through separate, supposedly identical devices. Because the background leakage current of P-type and N-type FETs varies in proportion to both process and temperature variations, the qualitative "shape" of the current signature will be the same for any two "good" devices (i.e. devices with no detected defects). By contrast, a defective device will have one or more states characterized by abnormally high IDDQ values. Defective devices can be detected and screened out by comparing the degree of similarity between the current signature of the DUT and the "golden" current signature of a known "good" device.

Figure 4:
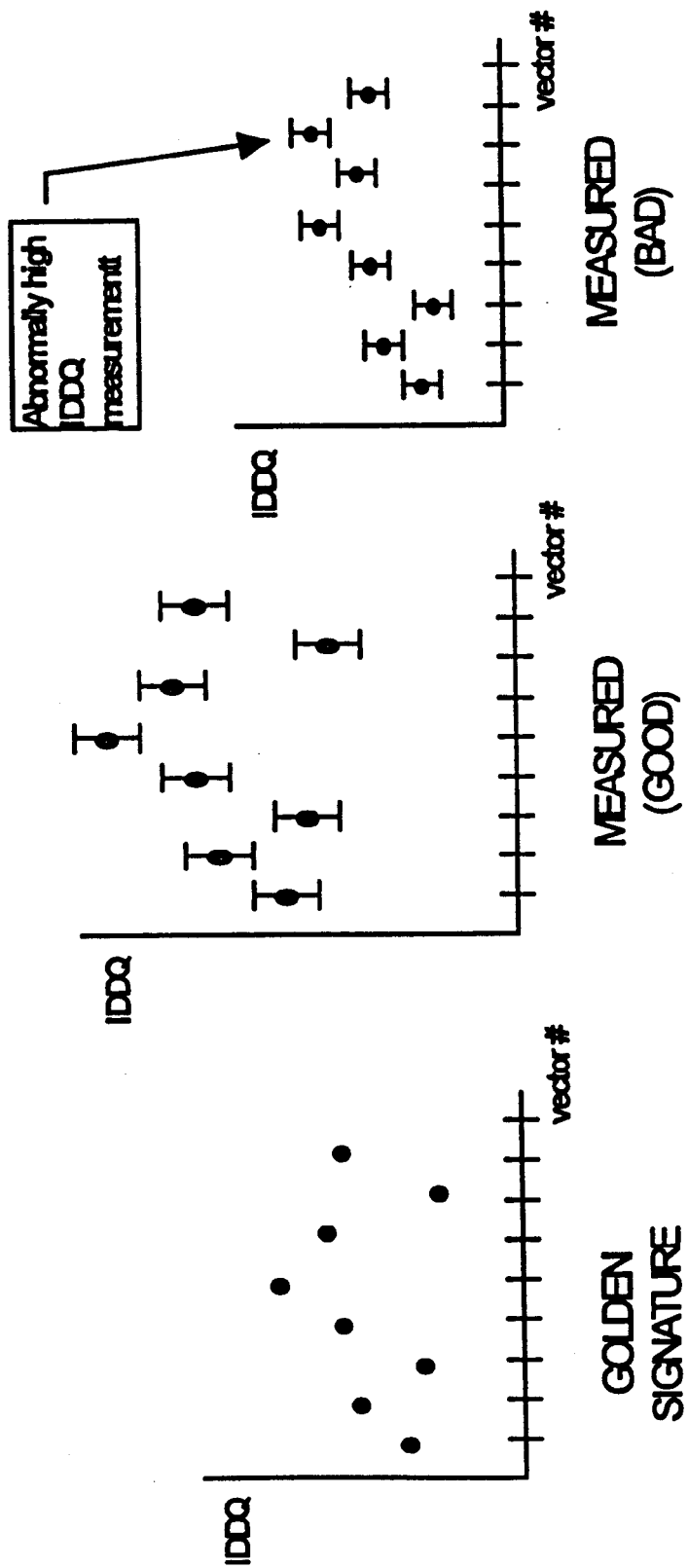
FIG. 4A graphically depicts a "golden signature" comprising IDDQ measurements corresponding to a series of test vectors for a known defect-free device.
FIG. 4B graphically depicts acceptable distributions of IDDQ measurements corresponding to a series of test vectors for a "good" (i.e. acceptable) device.
FIG. 4C graphically depicts unacceptable distributions of IDDQ measurements corresponding to a series of test vectors for a "bad" (i.e. unacceptable) device.

More particularly, FIG. 4A depicts an exemplary golden signature obtained by plotting IDDQ values obtained by applying different test vectors to a known "good" device. FIG. 4B depicts an IDDQ signature obtained by applying the same test vectors to a DUT; and, FIG. 4C depicts an IDDQ signature obtained by applying the same test vectors to another DUT. The FIG. 4B current signature has the same qualitative shape as the golden signature. That is, in both the golden and FIG. 4B signatures, the IDDQ value obtained for the first test vector is less than the IDDQ values obtained for the second, fourth, fifth, sixth and eighth test vectors but greater than the IDDQ values obtained for the third and seventh test vectors; the IDDQ value obtained for the second test vector is less than the IDDQ values obtained for the fourth, fifth, sixth and eighth test vectors but greater than the IDDQ values obtained for the first, third and seventh test vectors; the IDDQ value obtained for the third test vector is less than the IDDQ values obtained for the first, second, fourth, fifth, sixth and eighth test vectors but greater than the IDDQ value obtained for the seventh test vector; etc. However, the FIG. 4C current signature does not have the same qualitative shape as the golden signature, in that the FIG. 4C IDDQ value obtained for the seventh test vector is higher than the IDDQ values obtained for both the sixth and eighth test vectors, whereas the IDDQ value obtained for the golden signature's seventh test vector is lower than the IDDQ values obtained for both the sixth and eighth test vectors. The FIG. 4B current signature is accordingly representative of a "good" device, whereas the FIG. 4C current signature is representative of a defective device.

An analysis algorithm for making high speed IDDQ measurements with the aid of the FIG. 1 circuitry in a production test environment will now be described. The algorithm is efficient in that the required computation time varies linearly with the number of comparison points. Before execution of the algorithm, a "golden" reference signature for a known good device is determined, either through simulation or empirical measurement. If determined empirically, the golden reference signature is acquired by very careful measurement of the IDDQ drawn during application to the device of each selected test vector. It is important to minimize errors during any such empirical golden reference signature acquisition, either by using a slow but high precision measurement technique, or by averaging many acquisitions (or both).

During production testing, the DUT is measured at exactly the same test vectors as were used to determine the golden reference signature. It is critically important to know the uncertainty of each measurement taken during the production test. An error bar must be associated with each production test measurement, making it possible to state a confidence level that the actual value of IDDQ for any given DUT measurement falls inside or outside the error bars for that particular measurement.

Figure 5:
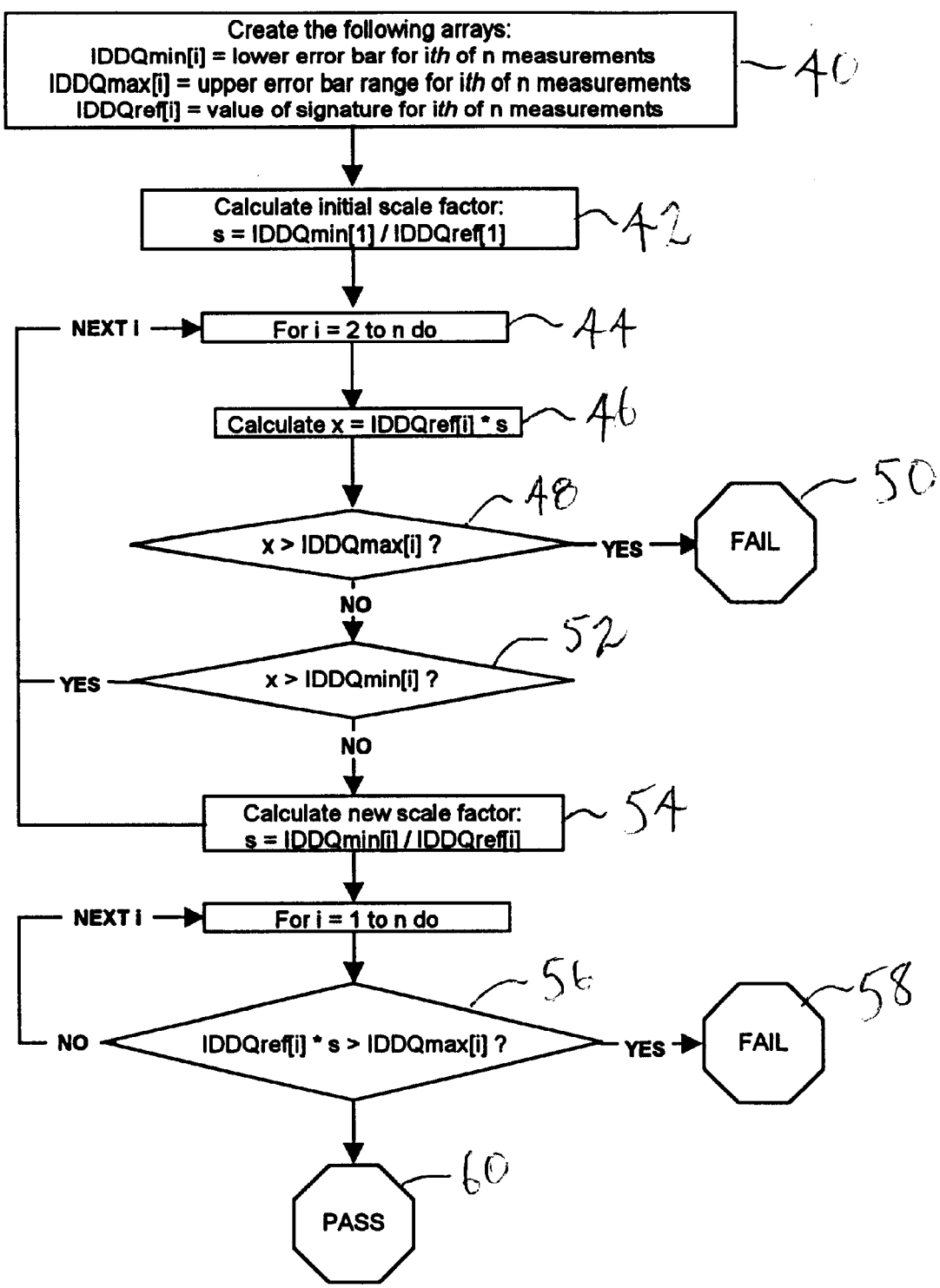
FIG. 5 is a flowchart of an algorithm for determining whether a golden signature can be linearly scaled to fit to a measured signature, in accordance with the invention.

Since the IDDQ signature scales with process as aforesaid, one may perform a one-dimensional (linear) fit of the golden reference signature to the measured signature, including the error bars. More particularly, if it is possible to apply any one scale factor to all of the IDDQ values comprising the golden signature, such that every scaled golden signature IDDQ value falls within the error bar for the corresponding IDDQ value of the measured signature, then the measured device is good. Conversely, if all scale factors applied to the IDDQ values comprising the golden signature result in at least one scaled golden signature IDDQ value falling outside the error bar for the corresponding IDDQ value of the measured signature, then the measured device is defective. It is only necessary to determine whether there is any possible linear fit of the golden signature to the measured signature; it is not necessary to derive a "best" fit of the golden signature to the measured signature. FIG. 5 depicts an algorithm for finding one such possible fit, as will now be described.

FIG. 5, block 40 illustrates an initialization step in which arrays required to maintain data values are established and initialized. Specifically, an array IDDQmin contains lower error bar values, with IDDQmin[i] representing the lower error bar value for the $i^{th}$ measurement; an array IDDQmax contains upper error bar values, with IDDQmax[i] representing the upper error bar value for the $i^{th}$ measurement; and, an array IDDQref contains golden reference signature values, with IDDQref[i] representing the golden reference signature value for the $i^{th}$ measurement. An initial scale factor s is derived (block 42) from the lower error bar value for the 1st measurement and the golden reference signature value for the 1st measurement: s=IDDQmin[1]/IDDQref[1]. This is the value which will scale the first point in the reference signature to match the lower limit of the error bars for the first point in the measured signature. This effectively defines a lower limit for the overall scale factor, since any lower value would obviously result in the first point of the scaled reference falling outside of the corresponding error bars.

The scale factor s is then applied (block 46), to the next point in the reference signature. There are three possibilities:
1. If the calculated value x=IDDQref[i]*s exceeds the upper limit of the error bars for the corresponding point in the measured signature (i.e. if x>IDDQmax[i], block 48), then clearly no possible scale factor will result in a fit for all points, and the device is considered defective (block 50).
2. If the calculated value x=IDDQref[i]*s is less than the lower limit of the error bars for the corresponding point in the measured signature (i.e. if x <IDDQmin[i], block 52), then a new scale factor s=IDDQmin[i]/IDDQref[i] is computed (block 54) which will scale this reference point to match the lower limit of these error bars. This defines a new lower limit for the overall scale factor.
3. If the calculated value x=IDDQref[i]*s falls inside the error bars then the scale factor is already appropriate for this point and does not need adjusting.

The steps represented by blocks 44–54 are repeated for all remaining points in the reference signature. If it ever becomes necessary to reduce the scale factor to accommodate a particular point, then no possible scale factor will allow all points to fit the measured data, and the device is defective (block 50).

Once the minimum scale factor across all points is determined as aforesaid, it is necessary to apply this factor to all points to ensure that they are all below the upper limit of the corresponding error bars (block 56). If any scaled point is found to be above the upper limit then no possible scale factor will result in a fit and the device is considered defective (block 58).

If the scale factor is not disqualified by the block 56 test then it can be concluded that the current scale factor satisfies the criterion of allowing the reference signature to fit inside the measured signature error bars, and therefore no IDDQ defects have been detected. The adaptive nature of the FIG. 5 signature analysis algorithm permits it to distinguish defective devices from fault-free devices even for deep sub-micron SOC designs with background leakage currents that may vary by orders of magnitude with over process and temperature.

As will be apparent to those skilled in the art in the light of the foregoing disclosure, many alterations and modifications are possible in the practice of this invention without departing from the spirit or scope thereof. For example, DPDT relay switch 16 is optional and may be omitted. Similarly, a PMU is optional and may be omitted. Various current mirror configurations can be used, such as a pair of PNP bipolar transistors, or FET or op-amp based current mirror circuits. Buffer 14 may take various forms, such as an AC-coupled FET follower circuit, or any low input capacitance op-amp follower circuit. Capacitor $C_3$ can be eliminated if careful consideration is given to the selection of Q1. In particular, if Q1's parasitic drain-to-source capacitance (inherent discharge capacitance) $C_{DS}$ is approximately equal to $C_3$, then Q1's $C_{DS}$ can serve as the integrating capacitance, dispensing with the need for a discrete capacitor such as $C_3$. Alternate instruments can be used to make timing measurements. In the preferred embodiment a Wavecrest DTS-2075 was chosen for its high accuracy, high precision and high throughput. However, many alternate timing measurement techniques are possible, including oscilloscope measurements, or even constructing a suitable timing circuit directly on the loadboard. Persons skilled in the art will understand that various alternative signature analysis algorithms can be used to attain improved accuracy in some circumstances. For example, the golden and measured signatures may be correlated with one another; or, one may employ a two-dimensional fitting of the golden signature to the measured signature (i.e. offset and scale factor, rather than just scale factor).

What is claimed is:

1. Apparatus for measuring an IDDQ value characterizing a test device, said apparatus comprising:
    (a) a current mirror coupled between a power supply and said test device, said current mirror for mirroring current flowing in a first current path to flow in a second current path, said first current path coupling said power supply to said test device, said second current path coupling said power supply to an integrator; and,
    (b) a first switch for switching said second current path between a first state in which current flowing in said second current path bypasses said integrator, and a second state in which current flowing in said second current path flows through said integrator;
wherein rise time of a voltage produced across said integrator during said current flow through said integrator is proportional to said IDDQ value.

2. Apparatus as defined in claim 1, further comprising a second switch coupled between said power supply, said current mirror and said test device for disconnecting said test device from said current mirror without disconnecting said test device from said power supply.

3. Apparatus as defined in claim 2, wherein said second switch further comprises a double pole double throw relay switch having a first pole pair switchable between said power supply and said current mirror and a second pole pair switchable between said current mirror and a null point.

4. Apparatus as defined in claim 1, wherein:
   (a) said integrator further comprises a capacitor; and,
   (b) said first switch further comprises a transistor having a pair of switching terminals connected across said capacitor;
   wherein:
      (i) application of a first logic signal to said transistor turns said transistor on, causing current flowing in said second current path to bypass said capacitor, thereby discharging said capacitor; and,
      (ii) application of a second logic signal to said transistor turns said transistor off, causing current flowing in said second current path to flow through said capacitor, thereby charging said capacitor.

5. Apparatus as defined in claim 4, wherein said capacitor further comprises said transistor's inherent discharge capacitance.

6. Apparatus as defined in claim 4, said apparatus further comprising means for measuring said rise time.

7. Apparatus as defined in claim 6, wherein said means for measuring said rise time further comprises a buffer connected to an integrating terminal of said capacitor.

8. Apparatus as defined in claim 4, further comprising a second switch coupled between said power supply, said current mirror and said test device for disconnecting said test device from said current mirror without disconnecting said test device from said power supply.

9. Apparatus as defined in claim 8, wherein said second switch further comprises a double pole double throw relay switch having a first pole pair switchable between said power supply and said current mirror and a second pole pair switchable between said current mirror and a null point.

10. A method of measuring an IDDQ value characterizing a test device, said method comprising:
    (a) mirroring current flowing through said test device to flow through a second current path;
    (b) operating said test device in a non-quiescent state while switching said second current path to cause said mirrored current flowing in said second current path to bypass a capacitor, thereby discharging said capacitor;
    (c) during said operation of said test device in said non-quiescent state, applying selected test vectors to said test device until said test device enters said quiescent state;
    (d) maintaining said test device in said quiescent state while switching said second current path to cause said mirrored current flowing in said second current path to flow through said capacitor, thereby charging said capacitor; and,
    (e) measuring rise time of a voltage produced across said capacitor during said charging of said capacitor;
    wherein said rise time is proportional to said IDDQ value.

11. A method as defined in claim 10, further comprising:
    (a) sequentially repeating said method to obtain a plurality of measured values of said rise time; and,
    (b) comparing each one of said measured rise time values to each one of a corresponding plurality of premeasured rise time values respectively representative of operation of a known defect-free copy of said test device in said quiescent state after application of said respective test vectors to said defect-free copy of said test device.

12. A method as defined in claim 10, further comprising:
    (a) sequentially repeating said method to obtain a plurality of measured values of said rise time;
    (b) for each ith one of a series of n of said measured rise time values, deriving a value IDDQmin[i] representative of a lowest approximation of error in said ith one of said measured values of said rise time;
    (c) for each ith one of said measured values of said rise time, deriving a value IDDQmax[i] representative of a highest approximation of error in said ith one of said measured values of said rise time;
    (d) for each ith one of said measured values of said rise time, deriving a corresponding reference value IDDQref[i] representative of operation of a known defect-free copy of said test device in said quiescent state after application to said defect-free copy of said test device of said test vector for which said ith one of said measured values of said rise time was derived;
    (e) deriving a scale factor s=IDDQmin[1]/IDDQref[1];
    (f) for each ith one of said measured values of said rise time, where $2 \leq i \leq n$, iteratively:
       (i) deriving a value x=IDDQref[i]*s;
       (ii) if x>IDDQmax[i], declaring said test device to be defective;
       (iii) if IDDQmin[i]$\leq$x$\leq$IDDQmax[i], incrementing i and continuing said iteration;
       (iv) if x<IDDQmin[i], rederiving said scale factor as s=IDDQmin[i]/IDDQref[i], incrementing i and continuing said iteration; and,
    (g) if IDDQref[i]*s>IDDQmax[i] for any value of i, where $1 \leq i \leq n$, declaring said test device to be defective, and otherwise declaring said test device to be non-defective.

* * * * *